United States Patent
Sewell et al.

(10) Patent No.: US 9,525,082 B2
(45) Date of Patent: Dec. 20, 2016

(54) SOLAR CELL CONTACT STRUCTURES FORMED FROM METAL PASTE

(71) Applicants: Richard Hamilton Sewell, Los Altos, CA (US); Michael Cudzinovic, Sunnyvale, CA (US)

(72) Inventors: Richard Hamilton Sewell, Los Altos, CA (US); Michael Cudzinovic, Sunnyvale, CA (US)

(73) Assignee: SunPower Corporation, San Jose, CA (US)

( * ) Notice: Subject to any disclaimer, the term of this patent is extended or adjusted under 35 U.S.C. 154(b) by 473 days.

(21) Appl. No.: 14/040,289

(22) Filed: Sep. 27, 2013

(65) Prior Publication Data
US 2015/0090330 A1   Apr. 2, 2015

(51) Int. Cl.
*H01L 31/0224* (2006.01)
*H01L 31/18* (2006.01)

(52) U.S. Cl.
CPC ............ *H01L 31/022425* (2013.01); *H01L 31/022441* (2013.01); *H01L 31/18* (2013.01); *Y02E 10/50* (2013.01)

(58) Field of Classification Search
CPC ............ H01L 31/022425; H01L 31/022441; H01L 31/18
See application file for complete search history.

(56) References Cited

U.S. PATENT DOCUMENTS

| | | | | |
|---|---|---|---|---|
| 3,444,004 A | * | 5/1969 | Smith | ............... H01M 4/8807 429/524 |
| 2011/0073178 A1 | | 3/2011 | Tan et al. | |
| 2011/0211246 A1 | | 9/2011 | Agrawal et al. | |
| 2011/0217809 A1 | | 9/2011 | Li et al. | |

(Continued)

FOREIGN PATENT DOCUMENTS

| | | | |
|---|---|---|---|
| DE | 102014206592 a1 | * | 10/2015 |
| WO | WO-2011138998 | | 11/2011 |
| WO | WO2011138998 a1 | * | 11/2011 |

OTHER PUBLICATIONS

English Machine translation for WO2011138998A1, Yoo et al. Nov. 10, 2011.*

(Continued)

*Primary Examiner* — Susan D Leong
(74) *Attorney, Agent, or Firm* — Blakely Sokoloff Taylor Zafman LLP

(57) ABSTRACT

Solar cell contact structures formed from metal paste and methods of forming solar cell contact structures from metal paste are described. In a first example, a solar cell includes a substrate. A semiconductor region is disposed in or above the substrate. A contact structure is disposed on the semiconductor region and includes a conductive layer in contact with the semiconductor region. The conductive layer includes a matrix binder having aluminum/silicon (Al/Si) particles and an inert filler material dispersed therein. In a second example, a solar cell includes a substrate. A semiconductor region is disposed in or above the substrate. A (Continued)

contact structure is disposed on the semiconductor region and includes a conductive layer in contact with the semiconductor region. The conductive layer includes an agent for increasing a hydrophobic characteristic of the conductive layer.

10 Claims, 3 Drawing Sheets

(56) References Cited

U.S. PATENT DOCUMENTS

2012/0037216 A1    2/2012  Kim et al.
2012/0142140 A1*   6/2012  Li .................. H01L 31/022441
                                                              438/98

OTHER PUBLICATIONS

Dinkel et al., DE102014206592A1, Oct. 2015, English equivalent of the abstract.*
International Search Report and Written Opinion from PCT/US2014/057311 mailed Dec. 31, 2014, 15 pgs.

* cited by examiner

SOLAR CELL CONTACT STRUCTURES FORMED FROM METAL PASTE

TECHNICAL FIELD

Embodiments of the present disclosure are in the field of renewable energy and, in particular, solar cell contact structures formed from metal paste and methods of forming solar cell contact structures from metal paste.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1A:
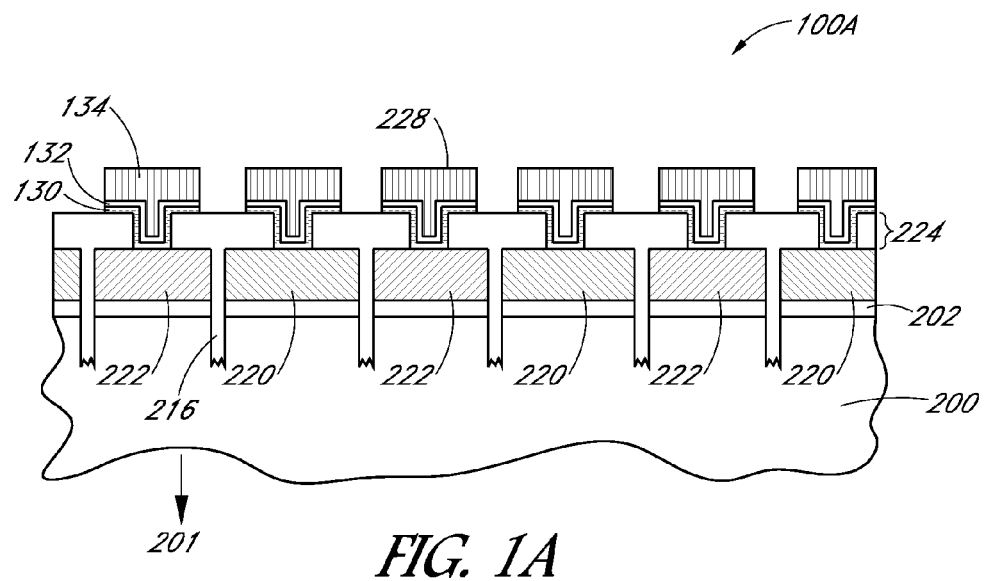
FIG. 1A illustrates a cross-sectional view of a portion of a solar cell having contact structures formed on emitter regions formed above a substrate, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Solar cell contact structures formed from metal paste and methods of forming solar cell contact structures from metal paste are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are solar cells having contact structures. In an embodiment a solar cell includes a substrate. A semiconductor region is disposed in or above the substrate. A contact structure is disposed on the semiconductor region and includes a conductive layer in contact with the semiconductor region. The conductive layer includes a matrix binder having aluminum/silicon (Al/Si) particles and an inert filler material dispersed therein.

In another embodiment, a solar cell includes a substrate. A semiconductor region is disposed in or above the substrate. A contact structure is disposed on the semiconductor region and includes a conductive layer in contact with the semiconductor region. The conductive layer includes an agent for increasing a hydrophobic characteristic of the conductive layer.

Also disclosed herein are methods of fabricating solar cells having contact structures. In an embodiment, a method of fabricating a solar cell involves forming a metal paste layer on a semiconductor region disposed in or above a substrate. The metal paste layer is formed from a mixture including aluminum/silicon (Al/Si) particles, a liquid binder, and an inert filler material. The semiconductor region is composed of monocrystalline or polycrystalline silicon. The method also involves forming a conductive layer from the metal paste layer, the forming performed without melting the inert filler material of the metal paste layer. The method also involves forming a contact structure for the semiconductor region of the solar cell, the contact structure including at least the conductive layer.

In another embodiment, a method of fabricating a solar cell involves forming a metal paste layer on a semiconductor region disposed in or above a substrate. The semiconductor region is a monocrystalline or polycrystalline silicon. The method also involves forming a conductive layer from the metal paste layer. The method also involves increasing hydrophobicity of the conductive layer. The method also involves, subsequent to increasing the hydrophobicity, forming a contact structure for the semiconductor region of the solar cell, the contact structure including at least the conductive layer.

In a first aspect, one or more embodiments described herein are directed to the inclusion of an inert filler material for metal pastes used in the fabrication of contact structures for solar cells. For example, in an embodiment, an inert filler material is used to enhance adhesion of metal printed paste to a substrate. In one such embodiment, very small particles are added to a paste matrix to fill voids between larger paste particles. The binder between particles becomes a binder/filler composite material that is less susceptible to shrinkage and cracking during paste firing.

To provide context, printed metal paste may be used as a low cost seed for subsequent metal plating operations for solar cell metallization. Liquid phase binders have been used as an alternative or complement to traditional glass fit-based binders as the primary method of adhering the metal particles to each other and to a receiving substrate. When liquid phase binders are used in a metal paste, volume shrinkage of the binder during paste firing can cause fracturing within the binder and reduce the cohesive and adhesive strength of the paste matrix.

Addressing the above issues, one or more embodiments described herein involve substituting the liquid binder component of a metal paste with a binder-filler mixture. By doing so, the adhesion of a metal paste can be improved. The net shrinkage of the binder-filler composite is relatively less than that for the binder alone. In one such embodiment, the net shrinkage is less since the filler does not shrink during a thermal conversion process which siloxane based binders typically undergo. In a particular embodiment, a suitable filler material is fumed silica, due to its small particle size (e.g., approximately in the range of 5-50 nanometers), compatibility with high temperature firing and compatibility with the Si—O binding in siloxane-based binders. A filler such as fumed silica can also act to increase the viscosity of a paste, and thus reduce the need for an additional organic rheology modifier such as ethyl cellulose which is typically added to metal pastes.

In a first exemplary cell, a seed layer is used to fabricate contacts, such as back-side contacts, for a solar cell having emitter regions formed above a substrate of the solar cell. For example, FIG. 1A illustrates a cross-sectional view of a portion of a solar cell having contact structures formed on emitter regions formed above a substrate, in accordance with an embodiment of the present disclosure.

Referring to FIG. 1A, a portion of a solar cell 100A includes a patterned dielectric layer 224 disposed above a plurality of n-type doped polysilicon regions 220, a plurality of p-type doped polysilicon regions 222, and on portions of a substrate 200 exposed by trenches 216. Contact structures 228 are disposed in a plurality of contact openings disposed in the dielectric layer 224 and are coupled to the plurality of n-type doped polysilicon regions 220 and to the plurality of p-type doped polysilicon regions 222. The materials of, and methods of fabricating, the patterned dielectric layer, the plurality of n-type doped polysilicon regions 220, the plurality of p-type doped polysilicon regions 222, the substrate 200, and the trenches 216 may be as described below in association with FIGS. 2A-2C. Furthermore, the plurality of n-type doped polysilicon regions 220 and the plurality of p-type doped polysilicon regions 222 can, in one embodiment, provide emitter regions for the solar cell 100A. Thus, in an embodiment, the contact structures 228 are disposed on the emitter regions. In an embodiment, the contact structures 228 are back contacts for a back-contact solar cell and are situated on a surface of the solar cell opposing a light receiving surface (direction provided as 201 in FIG. 1A) of the solar cell 100A. Furthermore, in one embodiment, the emitter regions are formed on a thin or tunnel dielectric layer 202, described in greater detail in association with FIG. 2A.

Referring again to FIG. 1A, each of the contact structures 228 includes a conductive layer 130 (also referred to herein as a seed layer) in contact with the emitter regions of the solar cell 100A. In an embodiment, the conductive layer 130 includes a matrix binder having aluminum/silicon (Al/Si) particles and an inert filler material dispersed therein. In one such embodiment, the conductive layer 130 has little to no cracks formed therein and, as such, is an essentially crack-free conductive layer. In another such embodiment, the inert filler material is dispersed in spaces between the Al/Si particles. In another such embodiment, the inert filler material is composed of fumed sub-micron silica particles.

In an embodiment, the seed layer 130 has a thickness greater than approximately 100 microns, and the contact structure 228 fabricated there from is a back contact of the solar cell composed essentially of only the conductive layer 130. However, in another embodiment, the conductive layer 130 has a thickness of approximately 2-10 microns. In that embodiment, the contact structure 228 is a back contact of the solar cell and is composed of the conductive layer 130, a nickel (Ni) layer 132 disposed on the conductive layer 130, and a copper (Cu) layer 134 disposed on the Ni layer 132, as depicted in FIG. 1A.

In a second exemplary cell, a seed layer is used to fabricate contacts, such as back-side contacts, for a solar cell having emitter regions formed in a substrate of the solar cell. For example, FIG. 1B illustrates a cross-sectional view of a portion of a solar cell having contact structures formed on emitter regions formed in a substrate, in accordance with an embodiment of the present disclosure.

Figure 1B:
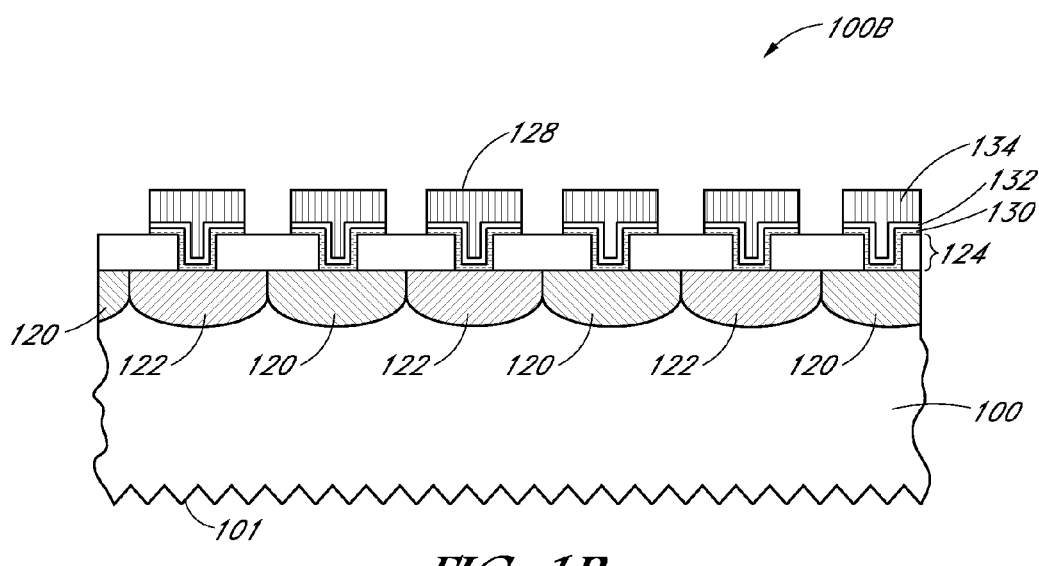
FIG. 1B illustrates a cross-sectional view of a portion of a solar cell having contact structures formed on emitter regions formed in a substrate, in accordance with an embodiment of the present disclosure.

Referring to FIG. 1B, a portion of a solar cell 100B includes a patterned dielectric layer 124 disposed above a plurality of n-type doped diffusion regions 120, a plurality of p-type doped diffusion regions 122, and on portions of a substrate 100, such as a bulk crystalline silicon substrate. Contact structures 128 are disposed in a plurality of contact openings disposed in the dielectric layer 124 and are coupled to the plurality of n-type doped diffusion regions 120 and to the plurality of p-type doped diffusion regions 122. In an embodiment, the diffusion regions 120 and 122 are formed by doping regions of a silicon substrate with n-type dopants and p-type dopants, respectively. Furthermore, the plurality of n-type doped diffusion regions 120 and the plurality of p-type doped diffusion regions 122 can, in one embodiment, provide emitter regions for the solar cell 100B. Thus, in an embodiment, the contact structures 128 are disposed on the emitter regions. In an embodiment, the contact structures 128 are back contacts for a back-contact solar cell and are situated on a surface of the solar cell opposing a light receiving surface, such as opposing a texturized light receiving surface 101, as depicted in FIG. 1B. In an embodiment, referring again to FIG. 1B, each of the contact structures 128 includes a seed layer 130 in contact with the emitter regions of the solar cell 100B. The seed layer 130 may be similar or the same as seed layer 130 described in association with FIG. 1A. Furthermore, in some embodiments, the seed layer 130 is used as the contact structure, while in other embodiments additional metal layers 132 and 134, such as Ni and Cu, are included in the contacts 128 (the latter depicted in FIG. 1B).

Although certain materials are described specifically above with reference to FIGS. 1A and 1B, some materials may be readily substituted with others with other such embodiments remaining within the spirit and scope of embodiments of the present disclosure. For example, in an embodiment, a different material substrate, such as a group III-V material substrate, can be used instead of a silicon substrate. In another embodiment, silver (Ag) particles or the like can be used in a seed paste in addition to Al particles. In another embodiment, plated or like-deposited cobalt (Co) or tungsten (W) can be used instead of or in addition to the Ni layer described above.

Furthermore, the formed contacts need not be formed directly on a bulk substrate, as was described in FIG. 1B. For example, in one embodiment, contact structures such as those described above are formed on semiconducting regions formed above (e.g., on a back side of) as bulk substrate, as was described for FIG. 1A. As an example, FIGS. 2A-2C illustrate cross-sectional views of various processing operations in a method of fabricating solar cells having contact structures, in accordance with an embodiment of the present disclosure.

Figure 2A:
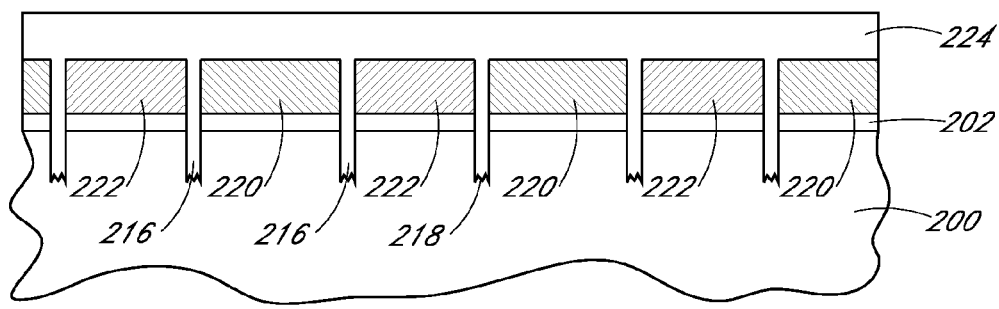
FIGS. 2A-2C illustrate cross-sectional views of various processing operations in a method of fabricating solar cells having contact structures, in accordance with an embodiment of the present disclosure.
Figure 2B:
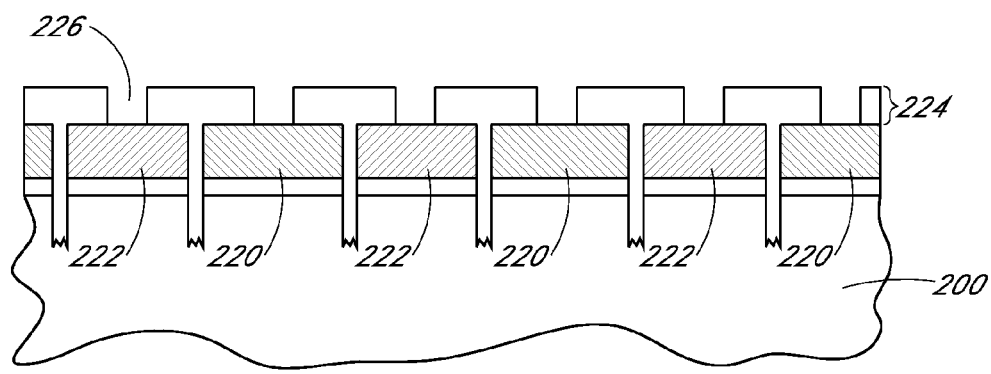
Figure 2C:
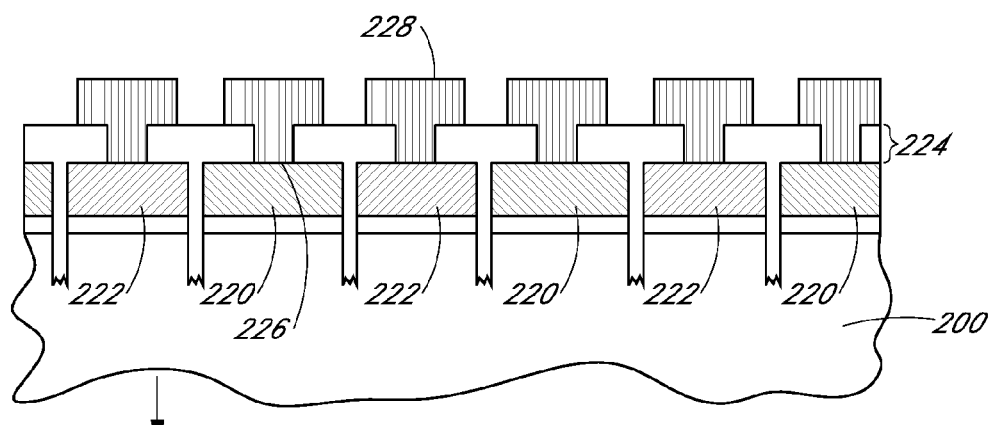

Referring to FIG. 2A, a method of forming contacts for a back-contact solar cell includes forming a thin dielectric layer 202 on a substrate 200.

In an embodiment, the thin dielectric layer 202 is composed of silicon dioxide and has a thickness approximately in the range of 5-50 Angstroms. In one embodiment, the thin dielectric layer 202 performs as a tunneling oxide layer. In an embodiment, substrate 200 is a bulk monocrystalline silicon substrate, such as an n-type doped monocrystalline silicon substrate. However, in an alternative embodiment, substrate 200 includes a polycrystalline silicon layer disposed on a global solar cell substrate.

Referring again to FIG. 2A, trenches 216 are formed between n-type doped polysilicon regions 220 and p-type doped polysilicon regions 222. Portions of the trenches 216 can be texturized to have textured features 218, as is also depicted in FIG. 2A. A dielectric layer 224 is formed above the plurality of n-type doped polysilicon regions 220, the plurality of p-type doped polysilicon regions 222, and the portions of substrate 200 exposed by trenches 216. In one embodiment, a lower surface of the dielectric layer 224 is formed conformal with the plurality of n-type doped polysilicon regions 220, the plurality of p-type doped polysilicon regions 222, and the exposed portions of substrate 200, while an upper surface of dielectric layer 224 is substantially flat, as depicted in FIG. 2A. In a specific embodiment, the dielectric layer 224 is an anti-reflective coating (ARC) layer.

Referring to FIG. 2B, a plurality of contact openings 226 is formed in the dielectric layer 224. The plurality of contact openings 226 provides exposure to the plurality of n-type doped polysilicon regions 220 and to the plurality of p-type doped polysilicon regions 222. In one embodiment, the plurality of contact openings 226 is formed by laser ablation. In one embodiment, the contact openings 226 to the n-type doped polysilicon regions 220 have substantially the same height as the contact openings to the p-type doped polysilicon regions 222, as depicted in FIG. 2B.

Referring to FIG. 2C, the method of forming contacts for the back-contact solar cell further includes forming contact structures 228 in the plurality of contact openings 226 and coupled to the plurality of n-type doped polysilicon regions 220 and to the plurality of p-type doped polysilicon regions 222. Thus, in an embodiment, contact structures 228 are formed on or above a surface of a bulk N-type silicon substrate 200 opposing a light receiving surface 201 of the bulk N-type silicon substrate 200. In a specific embodiment, the contact structures are formed on regions (222/220) above the surface of the substrate 200, as depicted in FIG. 2C.

Figure 3:
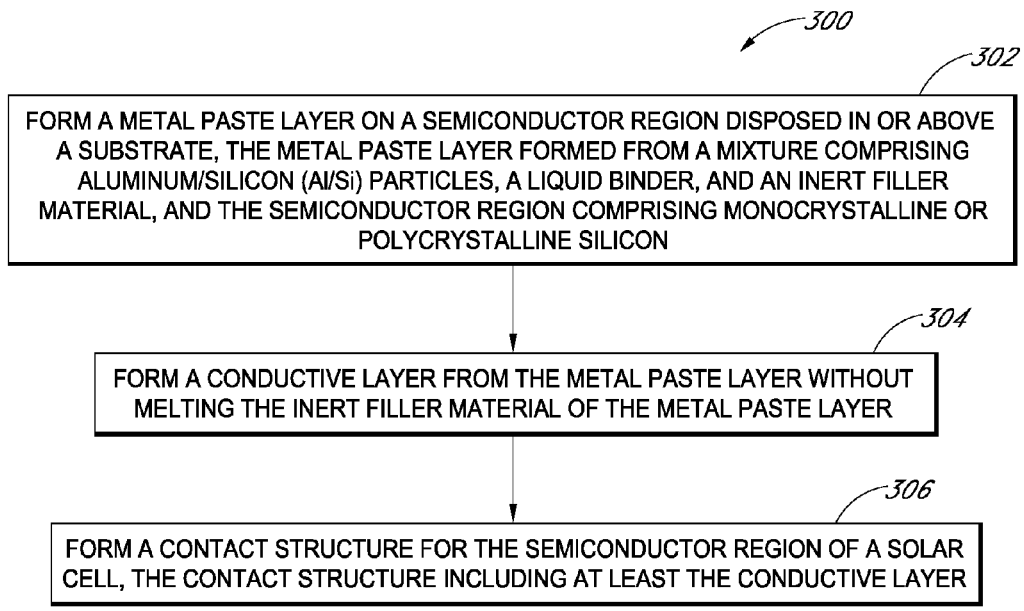
FIG. 3 is a flowchart illustrating operations in a method of fabricating a solar cell, in accordance with an embodiment of the present disclosure.

FIG. 3 is a flowchart 300 illustrating operations in a method of fabricating a solar cell, in accordance with an embodiment of the present disclosure. In an embodiment, referring to operation 302 of flowchart 300 and again to FIG. 2C, the contact structures 228 are fabricated by first forming a metal paste layer. Referring to operation 304 of flowchart 300, the metal paste layer is formed from a mixture including aluminum/silicon (Al/Si) particles, a liquid binder, and an inert filler material. Referring to operation 306 of flowchart 300, a conductive layer is formed from the metal paste layer, e.g., by firing the metal paste layer by heating in a furnace or by laser annealing. The conductive layer is formed without melting the inert filler material of the metal paste layer. A contact structure for the semiconductor regions 220 and 222 is then formed, the contact structure including at least the conductive layer.

In an embodiment, the metal paste layer is formed from a mixture where the liquid binder includes a siloxane, and the inert filler material includes fumed silica particles. In another embodiment, forming the metal paste layer involves solidifying the liquid binder having the inert filler material and the Al/Si particles dispersed therein. In one such embodiment, an essentially crack-free conductive layer is formed upon solidifying the liquid binder having the inert filler material and the Al/Si particles dispersed therein. In one other such embodiment, the method further involves, during the solidifying, dispersing the inert filler material in spaces between the Al/Si particles.

In an embodiment, the mixture further includes a frit material, and forming the metal paste layer involves melting the frit material. In one such embodiment, the inert filler material is composed of or includes fumed sub-micron silica particles, and the frit material is composed of or includes micron-scale glass particles. In an embodiment, the Al/Si particles in the mixture have volume approximately in the range of 25%-75% of the total composition volume of the mixture.

It is to be understood that the fired seed layer (e.g., the resulting conductive layer may be used on its own to form contact structures); in such cases, the conductive layer is still referred to herein as a seed layer. Alternatively, forming the contact structures further involves plating a nickel (Ni) layer on the metal seed layer, and electroplating a copper (Cu) layer on the Ni layer, e.g., to form structures such as those described in association with FIGS. 1A and 1B. In yet another alternative embodiment, forming the contact structures further involves electroplating a copper (Cu) layer directly on the metal seed layer.

In a second aspect, one or more embodiments described herein are directed to approaches for preventing moisture infiltration into porous pastes. Various methods are described below for preventing water from becoming trapped in the pores of a printed metal seed layer during solution-based plating operations otherwise intended to increase the conductivity of the seed layer. In accordance with an embodiment of the present disclosure, each of the methods described below enables the porosity of a printed seed layer to be reduced, or for the porosity to be made sufficiently unfavorable to water infiltration as to prevent water from becoming trapped in its pores. In some embodiment, water penetration is mitigated or prevented without requiring the printed seed layer to be annealed above its melting point. This can be especially important when conventional annealing conditions may include temperatures that damage the receiving solar cell onto which the seed layer has been applied.

To provide context, printed metal seed layers may be preferable to sputtered seed layers due to their low cost, high throughput, and ability to be deposited in any desired pattern without the need for subsequent mask and etch operations. However, since the seed layers are typically not sufficiently conductive to carry the large current densities generated in silicon-based solar cells, they are typically plated with other metals, e.g., nickel and copper, to enhance their conductivity. Using solution-based electroplating onto a porous seed layer can lead to significant amounts of trapped moisture, which can cause reliability problems (e.g., especially when highly acidic or basic chemistry is trapped in the pores) and adhesion problems (e.g., when trying to solder onto a metal layer with trapped moisture underneath). Several approaches are described below for preventing moisture from becoming trapped in the porosity of such printed metal films during subsequent solution based metal plating operations.

Addressing the above issues, embodiments described herein are directed to preventing moisture from becoming trapped in the pores of a printed metal SEED layer. In a first exemplary embodiment, an internal surface of a printed metal is made to be hydrophobic using a self-assembled monolayer (SAM), such that moisture is inhibited from entering the pores during a subsequent plating process but still provides the capability of wetting the top of the film for the plating process. In one such embodiment, the entire metal seed surface is coated with hydrophobic alkanethiols, which can be removed by UV exposure. Exposing the printed seed layer to UV light can allow the outer SAM to be UV-degraded and removed, while leaving the SAM in the interior pores of the printed seed layer intact. In a second exemplary embodiment, a pore-filling material is deposited subsequent to printing the seed layer. In one such embodiment, the pore-filling material fills the porosity in the seed layer, is resistant to plating chemistry, and can contribute to the adhesion of the printed seed layer to the receiving substrate or wafer. In a specific such embodiment, the pore-filling material is one such as, but not limited to, a siloxane or a spin-on-glass. In order to enable plating on top of the printed seed layer, the fill-in layer has characteristics and is deposited in such a way that the porosity is filled with minimal over-coating on top of the printed seed layer. Any residual over-coated layer can be removed by a chemical or physical etch operation to allow for plating onto the top of the seed layer. In a third exemplary embodiment, a low-melting point metal is included in the printed seed layer, such that some or all of the metal particles in the layer melt and flow during a high temperature anneal. The result is a relatively dense film with minimal porosity. In a fourth exemplary embodiment, a reduced particle size is used with a binder material that coats the printed seed particles with a uniform thickness. In one such embodiment, by reducing the particle size to the point that the particle diameter, and therefore the space between the particles, is on the order of the thickness of binder material coating the particles, the entire volume of the printed seed layer is occupied either by particles or by the binder.

As an example, with reference again to FIGS. 1A and 1B, each of the contact structures 228 or 128, respectively, includes a conductive layer 130 (also referred to herein as a seed layer) in contact with the emitter regions of the solar cell 100A or 100B. In an embodiment, the conductive layer 130 includes an agent for increasing a hydrophobic characteristic of the conductive layer. In one such embodiment, the agent is a hydrophobic self-assembled monolayer (SAM) disposed throughout at least a portion of the conductive layer. In another such embodiment, the agent is a pore-filling material.

The above described seed layer 130 can, in an embodiment, have a thickness greater than approximately 100 microns, and the contact structures 128 or 228 fabricated there from are composed essentially of only the conductive layer 130. However, in another embodiment, the conductive layer 130 has a thickness of approximately 2-10 microns. In that embodiment, the contact structures 128 or 228 are composed of the conductive layer 130, a nickel (Ni) layer 132 disposed on the conductive layer 130, and a copper (Cu) layer 134 disposed on the Ni layer 132, as depicted in FIGS. 1A and 1B.

Figure 4:
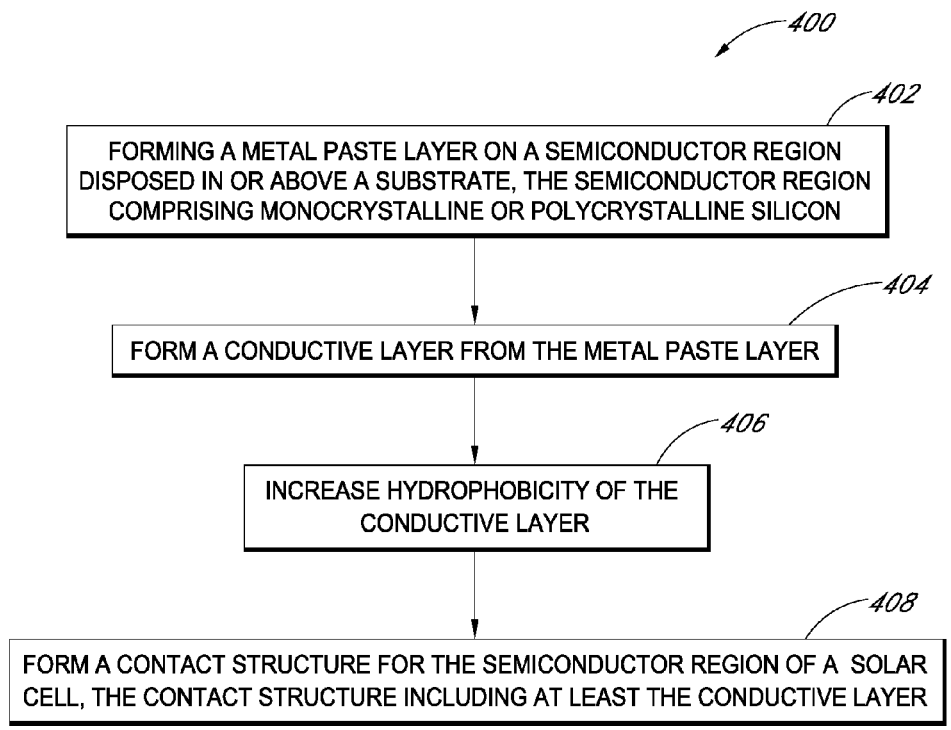
FIG. 4 is a flowchart illustrating operations in a method of fabricating a solar cell, in accordance with an embodiment of the present disclosure.

FIG. 4 is a flowchart 400 illustrating operations in a method of fabricating a solar cell, in accordance with an embodiment of the present disclosure. With reference to operation 402 of flowchart 400 and again to FIG. 2C, in an embodiment, the contact structures 228 are fabricated by first forming a metal paste layer. Referring to operation 404 of flowchart 400, a conductive layer is formed from the metal paste layer, e.g., by firing the metal paste layer by heating in a furnace or by laser annealing. Referring to operation 406 of flowchart 400, the hydrophobicity of the conductive layer is then increased to prevent moisture infiltration. Referring to operation 408 of flowchart 400, subsequent to increasing the hydrophobicity, a contact structure for the semiconductor regions 220 and 222 is then formed, the contact structure including at least the conductive layer.

In an embodiment, moisture trapping in the conductive layer during the forming the contact structure is mitigated or prevented by the prior increasing of the hydrophobicity of the conductive layer. In one such embodiment, increasing the hydrophobicity of the conductive layer involves reducing the hydrophilicity of the conductive layer by forming a hydrophobic self-assembled monolayer (SAM) throughout at least a portion of the conductive layer. In another such embodiment, increasing the hydrophobicity of the conductive layer involves reducing the porosity of the conductive layer with a pore-filling material. In yet another such embodiment, increasing the hydrophobicity of the conductive layer involves reducing the porosity of the conductive layer by densification. In a specific such embodiment, a melt material is used to increase the hydrophobicity of the conductive layer by densification. In another specific such embodiment, an improved packing geometry is used to the increase the hydrophobicity of the conductive layer by densification.

In a particular embodiment, PPSQ (a siloxane polymer) is dissolved in toluene and deposited onto (and into) printed seed layers by drop-casting and spin-coating. The resulting printed seed layers are significantly denser than the as-deposited printed seed films. The over-coating of PPSQ can then be removed by acid exposure and by plasma etching and/or sputtering by argon.

In an embodiment, the metal paste layer is formed from a mixture including aluminum/silicon (Al/Si) particles and a liquid binder. In an embodiment, the metal paste layer is formed by screen printing the metal paste layer. It is to be understood that the fired seed layer may be used on its own to form contact structures; in such cases, the conductive layer is still referred to herein as a seed layer. Alternatively, forming the contact structures further involves plating a nickel (Ni) layer on the metal seed layer, and electroplating a copper (Cu) layer on the Ni layer, e.g., to form structures such as those described in association with FIGS. 1A and 1B. In yet another alternative embodiment, forming the contact structures further involves electroplating a copper (Cu) layer directly on the metal seed layer.

Generally, as used in embodiments throughout, a formed paste layer (e.g., a deposited paste formed by printing) can further include a solvent for ease of delivery. The printing can includes using a technique such as, but not limited to, screen printing or ink-jet printing. Additionally, pastes described herein may include other elements such as binders or frit, within the spirit and scope of embodiments described herein.

Thus, solar cell contact structures formed from metal paste and methods of forming solar cell contact structures from metal paste have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

In an embodiment, a method of fabricating a solar cell involves forming a metal paste layer on a semiconductor region disposed in or above a substrate, the metal paste layer formed from a mixture comprising aluminum/silicon (Al/Si) particles, a liquid binder, and an inert filler material, and the semiconductor region including monocrystalline or polycrystalline silicon. The method also involves forming a conductive layer from the metal paste layer, the forming performed without melting the inert filler material of the metal paste layer. The method also involves forming a contact structure for the semiconductor region of the solar cell, the contact structure including at least the conductive layer.

In one embodiment, the metal paste layer is formed from the mixture including the liquid binder composed of siloxane, and the inert filler material composed of fumed silica particles.

In one embodiment, forming the metal paste layer involves solidifying the liquid binder having the inert filler material and the Al/Si particles dispersed therein.

In one embodiment, solidifying the liquid binder having the inert filler material and the Al/Si particles dispersed therein involves forming an essentially crack-free conductive layer.

In one embodiment, the method further involves, during the solidifying, dispersing the inert filler material in spaces between the Al/Si particles.

In one embodiment, the metal paste layer is formed from the mixture further including a frit material, and forming the metal paste layer involves melting the frit material.

In one embodiment, the metal paste layer is formed from the mixture including the inert filler material composed of fumed sub-micron silica particles, and the frit material composed of micron-scale glass particles.

In one embodiment, the metal paste layer is formed from the mixture including the Al/Si particles having a total composition volume of the mixture approximately in the range of 25%-75%.

In one embodiment, forming the metal paste layer on the semiconductor region involves screen printing the metal paste layer.

In one embodiment, forming the contact structure further involves plating a first metal layer on the conductive layer, and electroplating a second metal layer on the first metal layer.

In an embodiment, a solar cell includes a substrate. A semiconductor region is disposed in or above the substrate. A contact structure is disposed on the semiconductor region and includes a conductive layer in contact with the semiconductor region, the conductive layer including a matrix binder having aluminum/silicon (Al/Si) particles and an inert filler material dispersed therein.

In one embodiment, the conductive layer is an essentially crack-free conductive layer.

In one embodiment, the inert filler material is dispersed in spaces between the Al/Si particles.

In one embodiment, the inert filler material includes fumed sub-micron silica particles.

In one embodiment, the semiconductor region is a polycrystalline silicon layer of an emitter region disposed above the substrate.

In one embodiment, the semiconductor region is a diffusion region disposed in the substrate, and the substrate is a monocrystalline silicon substrate.

In one embodiment, the contact structure further includes a nickel (Ni) layer disposed on the conductive layer, and a copper (Cu) layer disposed on the Ni layer.

In one embodiment, the solar cell is a back-contact solar cell.

In an embodiment, a method of fabricating a solar cell involves forming a metal paste layer on a semiconductor region disposed in or above a substrate, the semiconductor region including monocrystalline or polycrystalline silicon. The method also involves forming a conductive layer from the metal paste layer. The method also involves increasing hydrophobicity of the conductive layer. The method also involves, subsequent to increasing the hydrophobicity, forming a contact structure for the semiconductor region of the solar cell, the contact structure including at least the conductive layer.

In one embodiment, the increasing the hydrophobicity of the conductive layer is to prevent moisture trapping in the conductive layer during the forming the contact structure.

In one embodiment, the increasing the hydrophobicity of the conductive layer involves reducing the hydrophilicity of the conductive layer by forming a hydrophobic self-assembled monolayer (SAM) throughout at least a portion of the conductive layer.

In one embodiment, the increasing the hydrophobicity of the conductive layer involves reducing the porosity of the conductive layer with a pore-filling material.

In one embodiment, the increasing the hydrophobicity of the conductive layer involves reducing the porosity of the conductive layer by densification.

In one embodiment, the increasing the hydrophobicity of the conductive layer by densification involves using a melt material.

In one embodiment, the increasing the hydrophobicity of the conductive layer by densification involves using an improved packing geometry.

In one embodiment, the forming the metal paste layer involves forming the metal paste layer from a mixture including aluminum/silicon (Al/Si) particles and a liquid binder.

In one embodiment, forming the metal paste layer on the semiconductor region involves screen printing the metal paste layer.

In one embodiment, forming the contact structure further involves plating a first metal layer on the conductive layer, and electroplating a second metal layer on the first metal layer.

In an embodiment, a solar cell includes a substrate. A semiconductor region is disposed in or above the substrate. A contact structure is disposed on the semiconductor region and includes a conductive layer in contact with the semiconductor region, the conductive layer including an agent for increasing a hydrophobic characteristic of the conductive layer.

In one embodiment, the agent is a hydrophobic self-assembled monolayer (SAM) disposed throughout at least a portion of the conductive layer.

In one embodiment, the agent is a pore-filling material.

In one embodiment, the semiconductor region is a polycrystalline silicon layer of an emitter region disposed above the substrate.

In one embodiment, the semiconductor region is a diffusion region disposed in the substrate, and wherein the substrate is a monocrystalline silicon substrate.

In one embodiment, the contact structure further includes a nickel (Ni) layer disposed on the conductive layer, and a copper (Cu) layer disposed on the Ni layer.

In one embodiment, the solar cell is a back-contact solar cell.

What is claimed is:

1. A solar cell, comprising:
   a substrate;
   a semiconductor region disposed in or above the substrate; and
   a contact structure disposed on the semiconductor region and comprising a conductive layer in contact with the semiconductor region, the conductive layer comprising a matrix binder having aluminum/silicon (Al/Si) particles and an inert filler material dispersed therein the conductive layer comprising a moisture impermeable porous layer, a self-assembled monolayer (SAM) sealing filling the pores of the porous layer, wherein the SAM only exists within the pores.

2. The solar cell of claim 1, wherein the conductive layer is an essentially crack-free conductive layer.

3. The solar cell of claim 1, wherein the inert filler material is dispersed in spaces between the Al/Si particles.

4. The solar cell of claim 1, wherein the inert filler material comprises fumed sub-micron silica particles.

5. The solar cell of claim 1, wherein the semiconductor region is a polycrystalline silicon layer of an emitter region disposed above the substrate.

6. The solar cell of claim 1, wherein the semiconductor region is a diffusion region disposed in the substrate, and wherein the substrate is a monocrystalline silicon substrate.

7. The solar cell of claim 1, the contact structure further comprising:
   a nickel (Ni) layer disposed on the conductive layer; and
   a copper (Cu) layer disposed on the Ni layer.

8. The solar cell of claim 1, wherein the solar cell is a back-contact solar cell.

9. A back contact solar cell, comprising:
   a substrate;
   a semiconductor region disposed in or above the substrate;
   a contact structure disposed on the semiconductor region and comprising a conductive layer in contact with the semiconductor region, the conductive layer comprising a matrix binder having aluminum/silicon (Al/Si) particles and an inert filler material dispersed in spaces between the Al/Si particles, the inert filler material comprising fumed sub-micron silica particles, wherein the contact structure further comprises a first metal layer disposed on the conductive layer and a second metal layer disposed on the first metal layer the conductive layer comprising a moisture impermeable porous layer, a self-assembled monolayer (SAM) sealing filling the pores of the porous layer, wherein the SAM only exists within the pores.

10. The back contact solar cell of claim 9, wherein the conductive layer is an essentially crack-free conductive layer.

* * * * *